(12) United States Patent
Suzuki

(10) Patent No.: US 7,280,384 B2
(45) Date of Patent: Oct. 9, 2007

(54) SEMICONDUCTOR MEMORY DEVICE

(75) Inventor: Hideaki Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/072,241

(22) Filed: Mar. 7, 2005

(65) Prior Publication Data

US 2005/0141260 A1 Jun. 30, 2005

Related U.S. Application Data

(63) Continuation of application No. PCT/JP2003/002210, filed on Feb. 27, 2003.

(51) Int. Cl.
*G11C 11/22* (2006.01)

(52) U.S. Cl. .................. 365/145; 365/148; 365/201

(58) Field of Classification Search ............. 365/145, 365/189.06, 203, 230.06, 201, 148
See application file for complete search history.

(56) References Cited

U.S. PATENT DOCUMENTS

| | | | |
|---|---|---|---|
| 5,430,671 A | 7/1995 | Hirano et al. | |
| 5,617,349 A | 4/1997 | Koike | |
| 6,731,554 B1 * | 5/2004 | Jacob et al. | 365/201 |
| 6,801,447 B2 * | 10/2004 | Murakuki | 365/145 |
| 6,826,099 B2 * | 11/2004 | Joachim et al. | 365/201 |
| 7,012,829 B2 * | 3/2006 | Kawashima et al. | 365/145 |
| 2001/0040814 A1 | 11/2001 | Takashima | |
| 2002/0031003 A1 | 3/2002 | Hoya et al. | |
| 2002/0044490 A1 | 4/2002 | Fuchikami et al. | |
| 2003/0026123 A1 | 2/2003 | Takashima | |

FOREIGN PATENT DOCUMENTS

| | | |
|---|---|---|
| EP | 0 721 191 B1 | 7/1986 |
| JP | 6-342597 | 12/1994 |
| JP | 2001-319472 | 11/2001 |
| JP | 2002-93155 | 3/2002 |
| JP | 2002074939 A | 3/2002 |

* cited by examiner

*Primary Examiner*—Anh Phung
*Assistant Examiner*—Pho M. Luu
(74) *Attorney, Agent, or Firm*—Arent Fox LLP.

(57) ABSTRACT

In a semiconductor memory device including memory cells respective having a ferroelectric capacitor, and are provided at intersection portions of sets of a plurality of word lines and plate lines which is adjacent thereto, with bit lines, clamp circuits are respectively connected between the bit lines and nodes being supplied with reference potentials. Herewith, electric charges supplied from the ferroelectric capacitors to the bit lines are extracted by the clamp circuits, and capacities of the bit lines are increased artificially. Consequently, during a data read operation, an amount of electric potential change of the bit lines according to stored data in the ferroelectric capacitors is improved, and it becomes possible to obtain a large potential difference between the bit lines.

12 Claims, 16 Drawing Sheets

F I G. 1
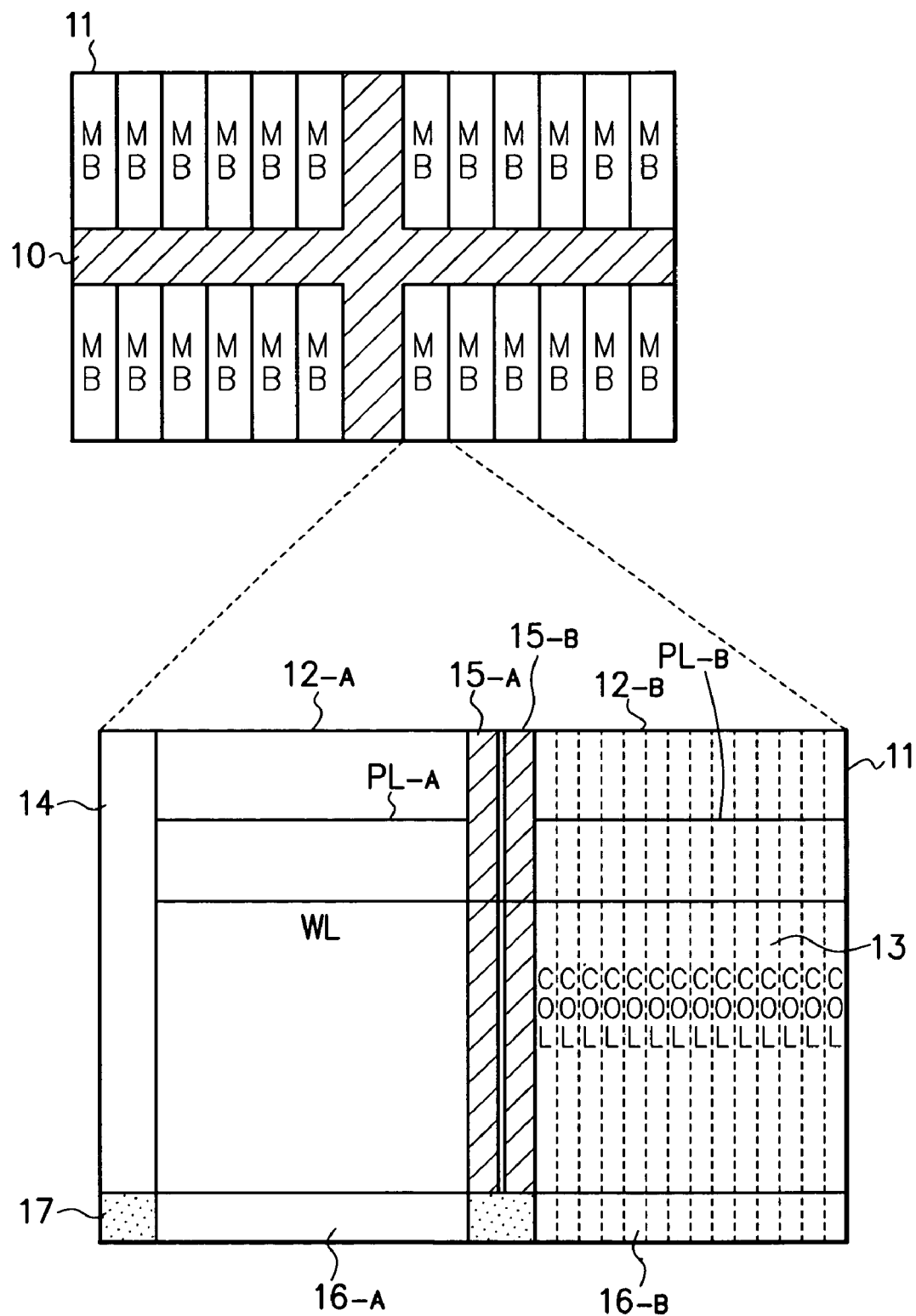

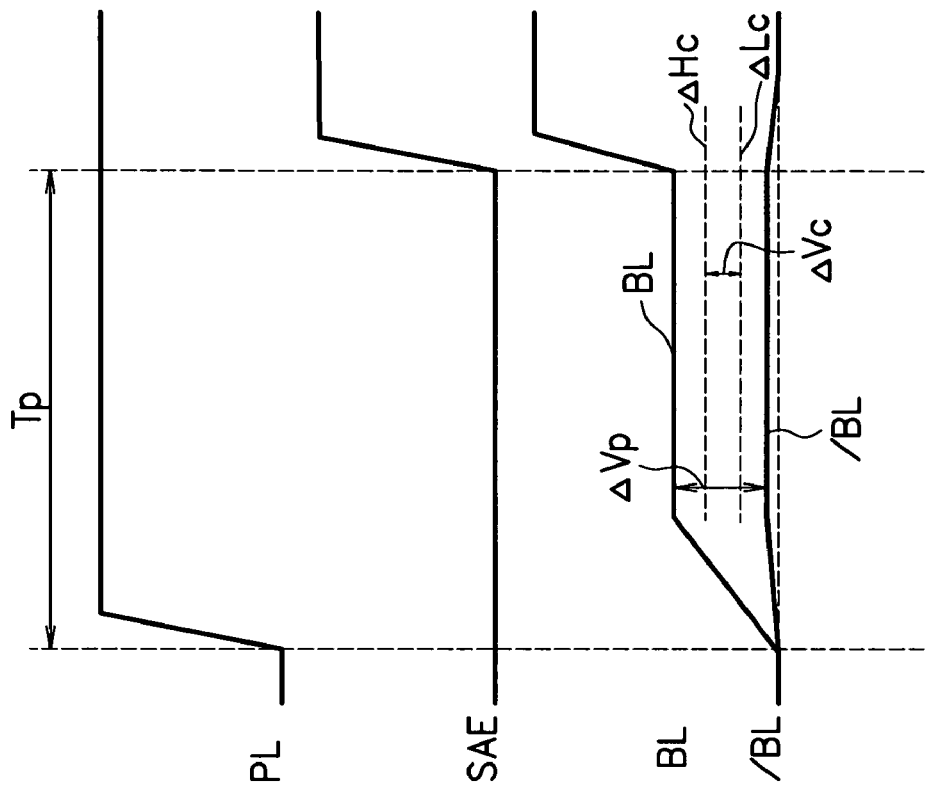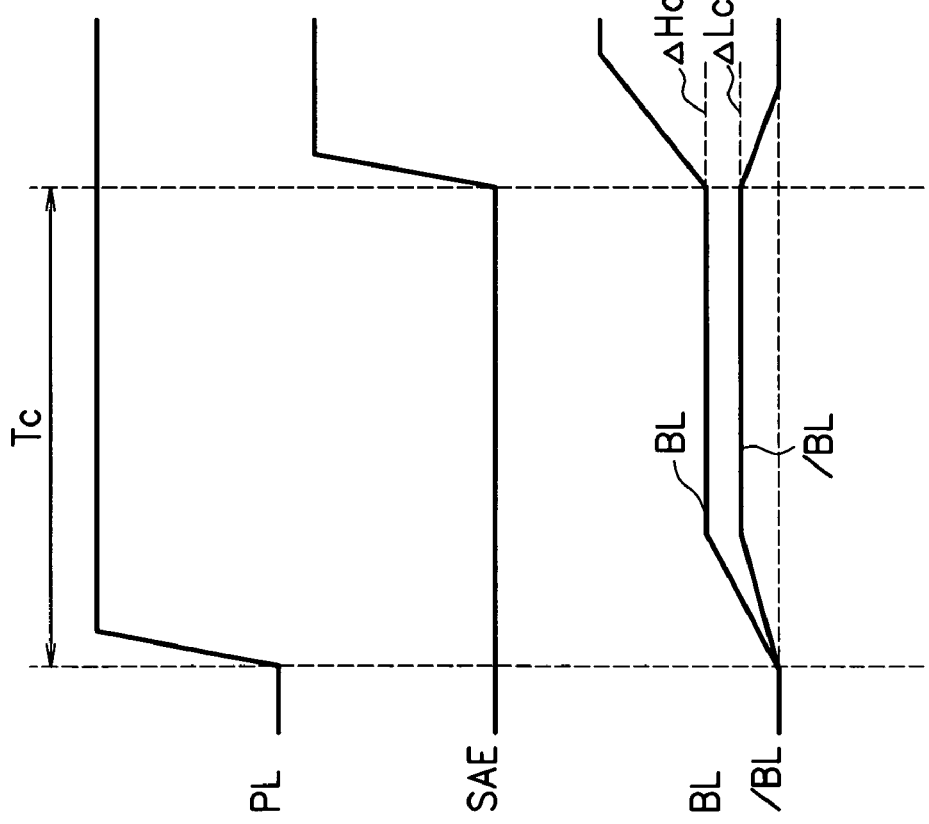

F I G. 13
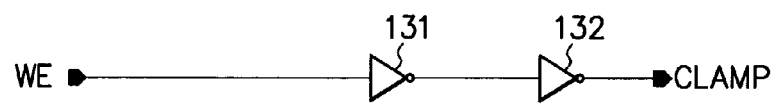

US 7,280,384 B2

SEMICONDUCTOR MEMORY DEVICE

CROSS-REFERENCE TO RELATED APPLICATION

This nonprovisional application is a continuation application of and claims the benefit of International Application Number PCT/JP2003/002210, filed Feb. 27, 2003. The disclosure of the prior application is hereby incorporated herein in its entirety by reference.

TECHNICAL FIELD

The present invention relates to a semiconductor memory device, and is particularly suitable for use in a ferroelectric memory using a ferroelectric capacitor in a memory cell.

BACKGROUND ART

In recent years, according to a popularization of portable devices, in stead of volatile memories such as a DRAM (Dynamic Random Access Memory), an SRAM (Static Random Access Memory), in which data stored in a memory are disappeared unless an electric power is continued to be supplied, a nonvolatile memory in which stored data can be kept without supplying an electric power attracts an attention. As the nonvolatile memory, an EPROM (Erasable and Programmable Read Only Memory), a flash memory, and so on, are already used widely, but they both are time-consuming in data writing, and therefore, the use and application thereof are limited to be used as memories capable for reading/writing of data.

On the other hand, a ferroelectric memory in which a ferroelectric is used for a memory cell, can read and write a data at a speed equivalent to a conventional SRAM, and has nonvolatilily of a stored data. The memory cell of the ferroelectric memory. has a similar configuration with the DRAM, and the ferroelectric (ferroelectric capacitor) is used for a capacitor portion to hold the data. Concretely speaking, one electrode of the ferroelectric capacitor is connected to a bit line via a MOS transistor of which gate is connected to a word line, and the other electrode is connected to a plate line.

FIG. 17 is a view showing a hysteresis characteristic of the ferroelectric capacitor. A horizontal axis represents a voltage applied to the ferroelectric capacitor (hereinafter, referred to just as an "applied voltage"), and when an electrode potential at a plate line side is higher than the electrode potential at a bit line side, it is regarded as positive (it is the same as in the following). Besides, a vertical axis represents a polarization charge amount, and a difference between a start point and an end point when it is shifted on a hysteresis curve in accordance with a change of the applied voltage, becomes to be an electric charge amount supplied from the ferroelectric capacitor.

In FIG. 17, when the applied voltage changes from 0 (zero) V to +VDD (power supply voltage) to 0 (zero) V to −VDD, and to 0 (zero) V, the polarization charge shifts from a point P1 to a point P2 to a point P3 to a point P4, and to a point P1. As shown in FIG. 17, on the hysteresis curve, there are two stable points P1 and P3, which have remanent polarizations and have different polarization directions, even when the applied voltage is 0 (zero) V. Data of "1" and "0 (zero)" are respectively corresponded to these points P1 and P3, and thereby, the ferroelectric memory can store the data, and a nonvolatile of the stored data becomes possible.

The ferroelectric memory applies a predetermined voltage to the ferroelectric capacitor based on a characteristic of the ferroelectric shown in FIG. 17, and performs a read/write of data from/to a memory cell.

As for the data write to the memory cell, when the "1" data is to be written, the voltage of −VDD is applied to the ferroelectric capacitor, for example, by turning the electric potential of the bit line to +VDD, and the electric potential of the plate line to 0 (zero) V. Besides, when the "0" (zero) data is to be written, the voltage of +VDD is applied to the ferroelectric capacitor, for example, by turning the electric potential of the bit line to 0 (zero) V, and the electric potential of the plate line to +VDD.

When a stored (written) data is read out of the memory cell, there are various methods to apply a voltage to the ferroelectric capacitor. At present, as for the read of a data out of the memory cell, a method is used in general, in which a voltage is applied to the ferroelectric capacitor toward a direction from the plate line side to the bit line side by, for example, turning the bit line to 0 (zero) V, and thereafter, turning it to a high impedance (floating) state, and turning the electric potential of the plate line to +VDD.

As described above, the data read out of the memory cell appears on the bit line as an electric potential at a certain level, and amplified by a sense amplifier, and so on, to be outputted. As for the electric potential appeared on the bit line in accordance with the read data, an explanation will be given by using FIG. 18. In FIG. 18, a horizontal axis represents a voltage applied to the ferroelectric capacitor, and a vertical axis represents a polarization charge amount.

When the bit line is turned to the high impedance state and the electric potential of the plate line is turned to +VDD, a potential difference between the electric potential of the plate line and the electric potential of the bit line is applied to the ferroelectric capacitor. Herewith, the respective data points shift toward the direction in which the applied voltage value is increasing (in the right direction in FIG. 18) on the hysteresis curve as shown by arrows in FIG. 18, and they stop at the positions corresponding to the voltage value finally applied to the ferroelectric capacitor. The difference between the polarization charge amount at the stopped position and the polarization charge amount before the voltage is applied, is the electric charge amount supplied (flow in) from the ferroelectric capacitor (memory cell) in the read operation.

The electric potential appeared on the bit line during the read operation can be obtained as a result of dividing the electric charge supplied from the ferroelectric capacitor in accordance with a ratio between a capacity of the bit line and the capacity of the ferroelectric capacitor. As it is obvious from FIG. 18, the electric charge amount supplied from the ferroelectric capacitor of the "1" data is larger and the electric potential change of the bit line becomes large.

Besides, in FIG. 18, the points P5 and P6 on the hysteresis curve are operating points when the "1" and "0" data are read respectively, and the difference of voltage values corresponding to the points P5 and P6 becomes to be a data margin (sense margin) DMC of the "1" data and the "0" data. The point P5 is an intersection point of a line (load curve) LC1 with the hysteresis curve, the line LC 1 of which a reference point is a point P7 corresponding to the polarization charge amount at the point P1 and the voltage +VDD applied to the plate line, and the load capacitance thereof is the capacity of the bit line. Similarly, the point P6 is the intersection point of a line LC2 with the hysteresis curve, the line LC2 of which the reference point is a point P8 corresponding to the polarization charge amount at the point P3 and the voltage +VDD applied to the plate line, and the load capacitance thereof is the capacity of the bit line.

As described above, in the conventional ferroelectric memory, the voltage applied to the ferroelectric capacitor and the electric potential appeared on the bit line, and so on, during the data read operation are determined in accordance with the ratio between the capacity of the bit line and the capacity of the ferroelectric capacitor, and the electric charge amount supplied from the ferroelectric capacitor.

Therefore, a memory cell configuration, and so on, in the ferroelectric capacitor has low flexibility, and therefore, there was a case when the capacity of the bit line and the capacity of the ferroelectric capacitor is not an adequate ratio relative to the number of the word lines determined by a design specification, namely, the number of the memory cells connected to one bit line. As a result, a state in which a sufficient voltage is not applied to the ferroelectric capacitor at the time of the data read occurs, and therefore, an error sensing of the read of data, and so on, may occur due to the small electric potential change of the bit line caused by the insufficient supply of the electric charge from the ferroelectric capacitor.

Further, the polarization charge amount of the ferroelectric memory decreases (deteriorate), and the data margin thereof becomes smaller in accordance with the increase of the number of rewrites. Consequently, there are trends that the data margin of the conventional ferroelectric memory becomes smaller, and an operating life of a device becomes shorter when the ratio between the capacity of the bit line and the capacity of the ferroelectric capacitor is not adequate.

There is disclosed a method to improve the electric potential appeared on the bit line by driving a circuit in the sense amplifier with controlling at the time of reading so as to suppress the above-described error sensing, and so on, to perform the data read accurately, in Japanese Patent Application Laid-open No. 2002-74939.

Besides, as it is obvious from the hysteresis curve of the ferroelectric capacitor shown in the above-stated FIG. 17 and FIG. 18, the electric charge amount supplied from the ferroelectric capacitor depends on the voltage applied to the ferroelectric capacitor. Therefore, when a data is read out of the memory cell, it is preferable to apply the voltage to the ferroelectric capacitor as large as possible.

For example, the bit line is connected relative to a ground to keep the electric potential of the bit line to be a ground level (0 (zero) V), and the electric potential of the word line is turned to +VDD, and thereby, it is possible to completely draw (make supply) the electric charge from the ferroelectric capacitor. However, all of the electric charge supplied from the ferroelectric capacitor flows into the ground, and therefore, it is impossible to output a data (information) stored in the ferroelectric capacitor.

Consequently, it is required to make the capacity of the bit line larger to apply a large voltage to the ferroelectric capacitor. However, for example, when a dummy capacitor is added to the bit line to increase the capacity of the bit line, it has almost no effect on rising the electric potential of the bit line (improve the data margin), because the capacity of the bit line also become large although an enough large voltage is applied to the ferroelectric capacitor at the time of reading, to increase the electric charge amount supplied from the ferroelectric capacitor.

Further, when the dummy capacitor is added to the bit line, a charge and discharge of the capacity of the dummy capacitor has to be performed at the time of amplification of the electric potential of the bit line by the sense amplifier, and at the time of a data write to the memory cell by a write amplifier, and thereby, a power consumption increases.

Patent Document 1

Japanese Patent Application Laid-open No. 2002-74939

SUMMARY OF THE INVENTION

The present invention is made in consideration of the above problems, and an object thereof is to improve an amount of an electric potential change of bit lines in accordance with a data stored in a ferroelectric capacitor, and to obtain a large potential difference between the bit lines, in a data read operation.

A semiconductor memory device of the present invention includes: sets of a plurality of word lines and plate lines; a plurality of bit lines; memory cells provided at an intersection portions of the sets of the word lines and the plate lines, with the bit lines, and respective having a ferroelectric capacitor; and clamp circuits, and the bit lines are connected to nodes being supplied with reference potentials via the clamp circuits.

According to the present invention constituted as above, when a data is read, electric charges supplied from the ferroelectric capacitors to the bit lines are extracted by the clamp circuits, and capacities of the bit lines are increased artificially. Herewith, higher voltages compared to a conventional means are applied to the ferroelectric capacitors, and thereby, the electric charges are supplied from the ferroelectric capacitors effectively, and it becomes possible to improve electric potential changes of the bit lines according to the data.

BRIEF DESCRIPTION OF THE DRAWINGS

FIG. 1 is a block diagram showing a configuration example of a ferroelectric memory applying a semiconductor memory device according to a first embodiment of the present invention;

FIG. 5A and FIG. 5B are views respectively showing electric potential changes of bit lines in the ferroelectric memory according to the first embodiment and the conventional ferroelectric memory;

FIG. 13 is a circuit diagram showing another example of the clamp control signal generation circuit;

DETAILED DESCRIPTION OF THE PREFERRED EMBODIMENTS

Figure 2:
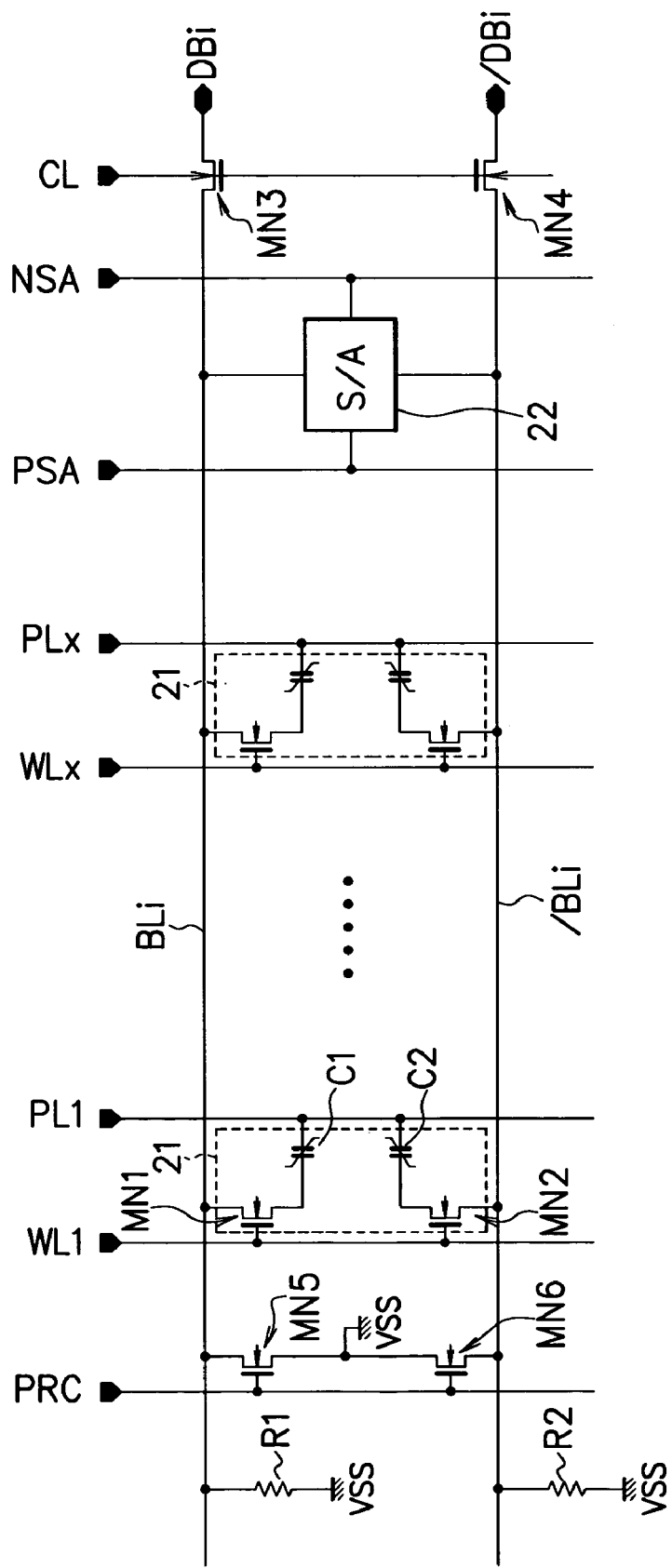
FIG. 2 is a circuit diagram showing an example of a column portion of the ferroelectric memory according to the first embodiment.

Hereinafter, embodiments of the present invention are described based on drawings.

First Embodiment

FIG. 1 is a block diagram showing a configuration example of a ferroelectric memory applying a semiconductor memory device according to a first embodiment of the present invention. The ferroelectric memory according to the first embodiment has a peripheral circuit 10 including an address decoder decoding an inputted address signal, an input/output buffer to input and output a data via a data bus, the respective control circuits, and so on, and a plurality of memory blocks 11.

Each memory block 11 is constituted by a plurality of (for example, two) banks $12_{-A}$, $12_{-B}$, a word line drive circuit 14 which selectively activates a word line WL in accordance with a result of decoding of the address signal, and so on, and a peripheral circuit 17 including control circuits, and so on, attached to the memory block 11. The banks $12_{-A}$, $12_{-B}$ respectively have plate line drive circuits $15_{-A}$, $15_{-B}$ which selectively activate plate lines $PL_{-A}$, $PL_{-B}$ in accordance with the results of decoding of the address signals, and a plurality of column portions (hereinafter, referred to also as "column unit") 13. The column portion 13 has two bit lines, which are not shown in FIG. 1, provided in an orthogonal direction to the word line WL and the plate line PL. $16_{-A}$, $16_{-B}$ are sense amplifier lines constituted by sense amplifiers (S/A) held by the respective column portions 13.

Here, the word line WL is held in common by all of the banks $12_{-A}$, $12_{-B}$ in the memory block 11, and is provided by every memory block 11, and the plate lines $PL_{-A}$, $PL_{-B}$ are provided by every bank $12_{-A}$, $12_{-B}$. Incidentally, in FIG. 1, only one of each word line WL and plate lines $PL_{-A}$, $PL_{-B}$ are shown, for explanatory convenience, but the word lines WL and the plate lines PL are provided in plural in the memory blocks 11 and the banks 12, respectively.

FIG. 2 is a circuit diagram showing an example of the column portion 13, and shows a case when one memory cell (a minimum unit of a data storage) is a two transistors/two capacitors (2T/2C) type memory cell constituted by two transistors and two ferroelectric capacitors, as an example.

In FIG. 2, BLi, /BLi are bit lines (the bit lines BLi, /BLi are in relation of complementary data), WLj is a word line, PLj is a plate line, PRC is a precharge signal line, CL is a column signal line, DBi, /DBi are data signal lines connected to data buses. PSA, NSA are connected to a sense amplifier 22, and they are control signal lines to supply driving voltages to a P-channel MOS transistor (pullup transistor) and an N-channel MOS transistor (pulldown transistor) which are held by the sense amplifier 22. Incidentally, in the word line WLj and the plate line PLj, "j" is a subscript and is an arbitrary natural number of "j=1 to x".

The column portion 13 has a plurality of memory cells 21 and the sense amplifier 22 amplifying the electric potential between the bit lines BLi, /BLi. The memory cells 21 and the sense amplifier 22 are respectively connected to the two bit lines BLi, /BLi. Each memory cell 21 has the same configuration, and therefore, the configuration is described with reference to the memory cell 21 connected to the word line WL1 and the plate line PL1, in the following.

The memory cell 21 is constituted by two N-channel MOS transistors MN1, MN2 as cell transfers and two ferroelectric capacitors C1, C2. A source of the transistor MN1 is connected to the bit line BLi, and a gate thereof is connected to the word line WL1. One electrode of the ferroelectric capacitor C1 is connected to a drain of the transistor MN1, and the other electrode is connected to the plate line PL1. Similarly, a source of the transistor MN2 is connected to the bit line /BLi, and a gate thereof is connected to the word line WL1. One electrode of the ferroelectric capacitor C2 is connected to a drain of the transistor MN2, and the other electrode is connected to the plate line PL1. The memory cell 21 stores a data in relation of complementary data by a combination of a set of the transistor MN1 and the ferroelectric capacitor C1, and a set of the transistor MN2 and the ferroelectric capacitor C2.

MN3, MN4 are N-channel MOS transistors as so-called column gates. Drains of the transistors MN3, MN4 are respectively connected to the bit lines BLi, /BLi, and sources thereof are respectively connected to the data signal lines DBi, /DBi. Gates of the transistors MN3, MN4 are connected to the column signal line CL.

MN5, MN6 are N-channel MOS transistors, and drains of the transistors MN5, MN6 are respectively connected to the bit lines BLi, /BLi. Sources of the transistors MN5, MN6 are connected to a node being supplied with a reference potential VSS (for example, a ground (GND)), and gates of the transistors MN5, MN6 are connected to the precharge signal line PRC. Incidentally, in the following explanation, "to be connected to the node being supplied with the reference potential VSS" is inscribed as "to be connected relative to the reference potential VSS", for explanatory convenience.

R1, R2 are resistors having equal resistance values, and one ends of the resistors R1, R2 are respectively connected to the bit lines BLi, /BLi, and the other ends thereof are connected relative to the reference potentials VSS. The resistors R1, R2 respectively constitute clamp circuits which attract electric charges (current) from the bit lines BLi, /BLi and operate to approximate the electric potentials of the bit lines BLi, /BLi to the reference potentials VSS. Namely, the resistors R1, R2 are to suppress a lowering of the voltages applied to the ferroelectric capacitors C1, C2 in accordance with the rising of the electric potentials of the bit lines BLi, /BLi when a data is read out of the memory cell 21.

Here, it is preferable that the resistance values of the resistors R1, R2 are large, so as not to attract excessive electric charges supplied from the ferroelectric capacitors C1, C2 in the memory cell 21, and the resistance values at approximately a few kilohm (for example, 1 kΩ) are desirable. Besides, the resistors R1, R2 are to be connected to the bit lines BLi, /BLi at an arbitrary positions, but distances (wiring length) between the resistors R1, R2 and the sense amplifier 22 on the bit lines BLi, /BLi are preferred to be long.

Next, operations are described.

Only a data read operation is explained, because a data write operation on the ferroelectric memory according to the first embodiment is almost the same as that in the conventional ferroelectric memory, and the explanation is not given.

Figure 3:
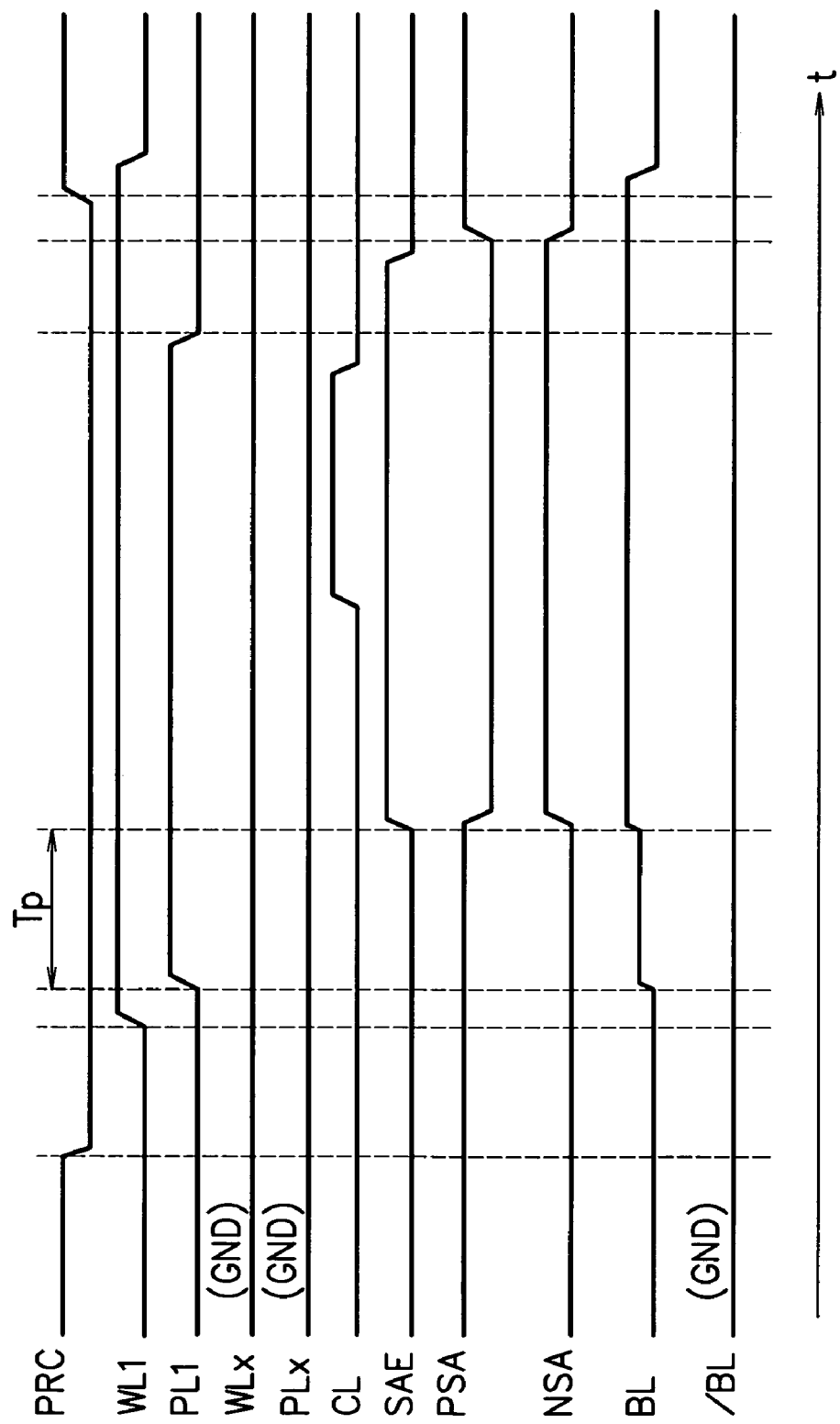
FIG. 3 is a timing chart showing a data read operation on the ferroelectric memory according to the first embodiment.

FIG. 3 is a timing chart showing a data read operation on the ferroelectric memory according to the first embodiment. Incidentally, FIG. 3 shows an operation when a data is read out of the memory cell 21 connected to the word line WL1, and the plate line PL1 as an example, and the corresponding memory cell 21 is storing a "1" data (the ferroelectric capacitors C1, C2 respectively store the "1" and a "0" data). Further, in the following explanation, the reference potential VSS is to be a ground level (GND: 0 (zero) V).

First, according to an activation of a not-shown chip select signal, the electric potential of the precharge signal line PRC (precharge signal) is activated to a high level (voltage +VDD, hereinafter, denoted by "H"). Herewith, the transistors MN5, MN6 are changed to continuity states (ON state), precharges of the bit lines BLi, /BLi are performed, and the electric potentials of the bit lines BLi, /BLi change to the ground levels.

Next, the electric potential of the precharge signal line PRC is inactivated to a low level (ground level, hereinafter, denoted by "L"), and the transistors MN5, MN6 are changed to insulating states (OFF state). Within this state, the electric potential of the word line WL1 is turned to "H", the transistors MN1, MN2 in the memory cell 21 are turned to the ON states, and thereafter, the electric potential of the plate line PL1 is turned to "H". Incidentally, the electric potentials of the word line WLj, the plate line PLj (word line WLx, plate line PLx are exemplified in FIG. 3) other than the word line WL1, the plate line PL1 are "L".

Herewith, the ferroelectric capacitors C1, C2 in the memory cell 21 are applied voltages in the direction from the plate line PL1 side to the bit lines BLi, /BLi side, and the stored data is read out of the memory cell 21. That is to say, the electric charges according to the data (polarization state) are respectively supplied from the ferroelectric capacitors C1, C2 to the bit lines BLi, /BLi, and the bit lines BLi, /BLi are charged up, and the electric potentials thereof rise (period Tp).

Here, as described above, the ferroelectric capacitors C1, C2, respectively connected to the bit lines BLi, /BLi, store the "1", "0" data, respectively (in a corresponding polarization state). Consequently, the electric charge amount supplied from the ferroelectric capacitor C1 to the bit line BLi is larger than the electric charge amount supplied from the ferroelectric capacitor C2 to the bit line /BLi, and the electric potential of the bit line BLi largely rises than that of the bit line /BLi.

Further, at this time, a part of the electric charge supplied from the ferroelectric capacitors C1, C2 to the bit lines BLi, /BLi flows into the ground via the resistors R1, R2, and thereby, the capacities of the bit lines BLi, /BLi are increased artificially. Herewith, in the ferroelectric memory according to the first embodiment, the lowering of the voltages applied to the ferroelectric capacitors C1, C2 in accordance with the rising of the electric potentials of the bit lines BLi, /BLi is suppressed, and a higher voltage compared to the conventional ferroelectric memory is applied to the ferroelectric capacitors C1, C2, and the electric charge amounts supplied to the bit lines BLi, /BLi becomes large.

After that, according to the activation of a sense amplifier signal SAE to be "H", the electric potentials of the control signal lines PSA, NSA (control signals PSA, NSA) respectively change to "L", "H", and the sense amplifier 22 is activated. A minute potential difference between the bit lines BLi, /BLi is amplified by the activated sense amplifier 22, and the electric potentials of the bit lines BLi, /BLi change to "H", "L", respectively.

Further, the electric potential of the column signal line CL (column signal) is activated to "H", and thereby, the transistors MN3, MN4 are to be in the "ON" states, and the electric potentials of the bit lines BLi, /BLi obtained by the amplification by the sense amplifier 22 are respectively transmitted to the data signal lines DBi, /DBi, to be outputted. Subsequently, the electric potential of the column signal line CL changes to "L", and the transistors MN3, MN4 are to be in the "OFF" states.

After the electric potential of the column signal line CL changes to "L", an operation called a restore operation is performed. Here, the restore operation is the operation to write back a data after a reading, because the data read operation on the ferroelectric memory is a destructive read, and the data stored in the memory cell (ferroelectric capacitor) is disappeared by the reading. For example, the write back of the "1" data in which the polarization state is inverted during the data read, is performed by keeping the electric potentials of the bit lines BLi, /BLi to the electric potentials at the time of a data output, and turning the electric potential of the plate line PL1 to "L".

After the restore operation is completed, the electric potentials of the control signal lines PSA, NSA are respectively turned to "H", "L", in accordance with the sense amplifier signal SAE which changes to "L", and the sense amplifier 22 is turned to the inactive state. Further, the electric potentials of the bit lines BLi, /BLi change to the ground level by turning the electric potential of the precharge signal line PRC to "H", and the electric potential of the word line WL1 is turned to "L", namely, the electric potentials of all word lines WLj are turned to "L" to complete the read operation.

Figure 4:
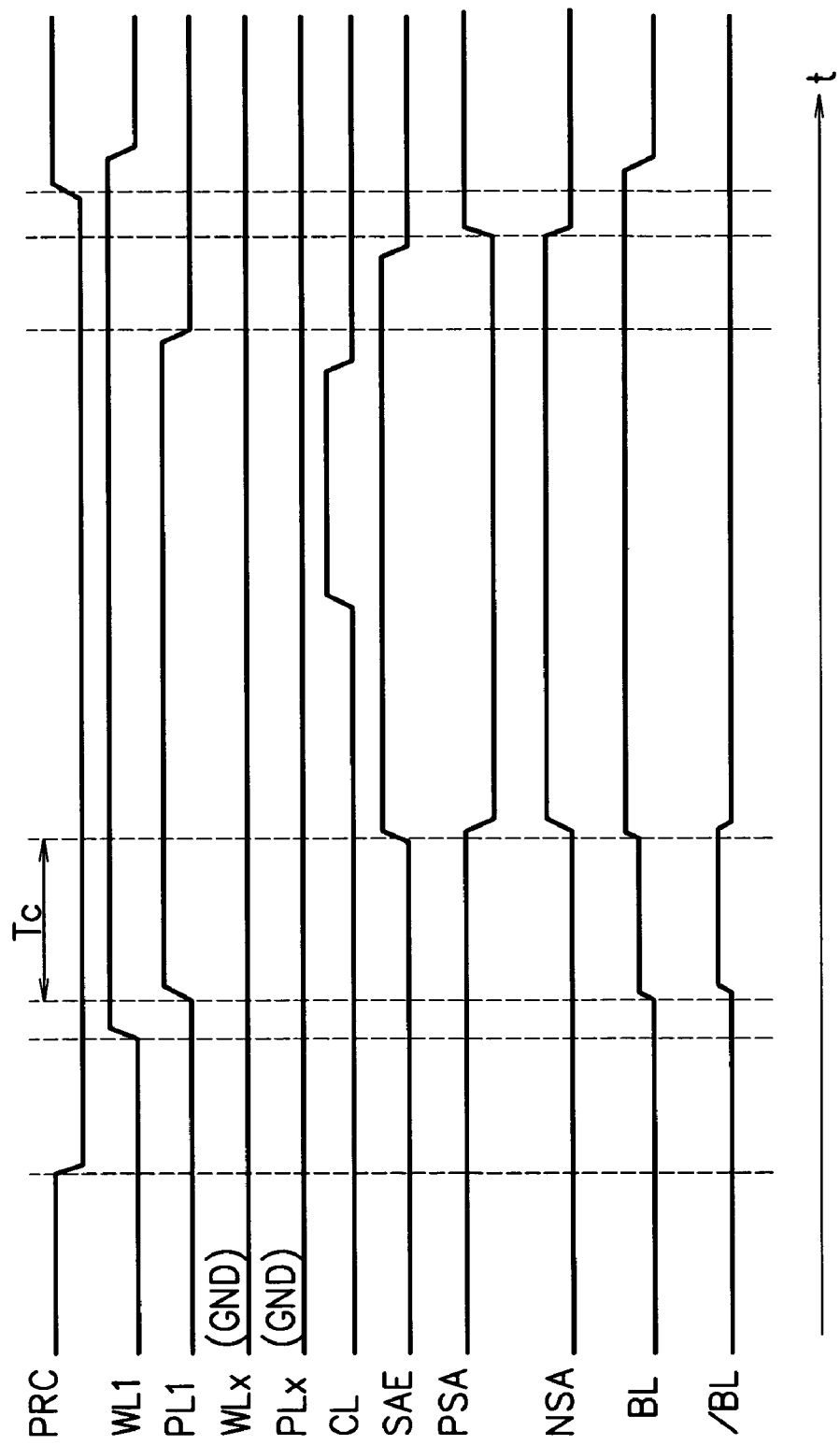
FIG. 4 is a timing chart showing a data read operation in a conventional ferroelectric memory.

The data read operation on the ferroelectric memory according to the first embodiment shown in the above-described FIG. 3 and the data read operation in the conventional ferroelectric memory are compared. FIG. 4 is a timing chart showing the data read operation in the conventional ferroelectric memory, and the electric potential changes of the bit lines BL, /BL are different from the data read operation on the ferroelectric memory according to the first embodiment shown in the above-described FIG. 3. More concretely, in the timing charts shown in FIG. 3 and FIG. 4, the electric potential changes of the bit lines BL, /BL are different during periods Tp (refer to FIG. 3), Tc (refer to FIG. 4) after the plate line PL1 is turned to "H", and before the sense amplifier signal SAE changs to "H" and the sense amplifier 22 is activated.

FIG. 5A and FIG. 5B are views showing the electric potential changes of the bit lines BL, /BL during the periods Tc, Tp shown in the above described FIG. 4 and FIG. 3, in detail.

As shown in FIG. 5A, in the data read operation on the conventional ferroelectric memory, according to the rising of the electric potentials of the bit lines BL, /BL, the voltages applied to the ferroelectric capacitors C1, C2 are lowered, and the electric potentials of the bit lines BL, /BL according to the electric charges supplied from the ferroelectric capacitors C1, C2 are to be electric potentials ΔHc, ΔLc. Therefore, a data margin between the "1" data and the "0" data is to be a potential difference ΔVc.

On the other hand, as shown in FIG. 5B, in the data read operation on the ferroelectric memory according to the first embodiment, the electric charges of the bit lines BL, /BL flow into the ground via the resistors R1, R2, and thereby, the capacities of the bit lines BL, /BL are increased artificially, and the lowering of the voltages applied to the ferroelectric capacitors C1, C2 is suppressed compared to the conventional means. In other words, the bit lines BL, /BL are clamped in the clamp circuit constituted by the resistors R1, R2, and thereby, the voltages applied to the ferroelectric capacitors C1, C2 become high, and the efficiency of supplying the electric charges from the ferroelectric capacitors C1, C2 to the bit lines BL, /BL is improved.

Herewith, in the ferroelectric memory according to the first embodiment, the electric potential of the bit line BL according to the electric charge supplied from the ferroelectric capacitor C1 becomes higher than the electric potential ΔHc, and the electric potential of the bit line /BL according to the electric charge supplied from the ferroelectric capacitor C2 becomes lower than the electric potential ΔLc. Consequently, the data margin between the "1" data and the "0" data becomes to be a potential difference ΔVp, which is larger than the conventional potential difference ΔVc.

Figure 6:
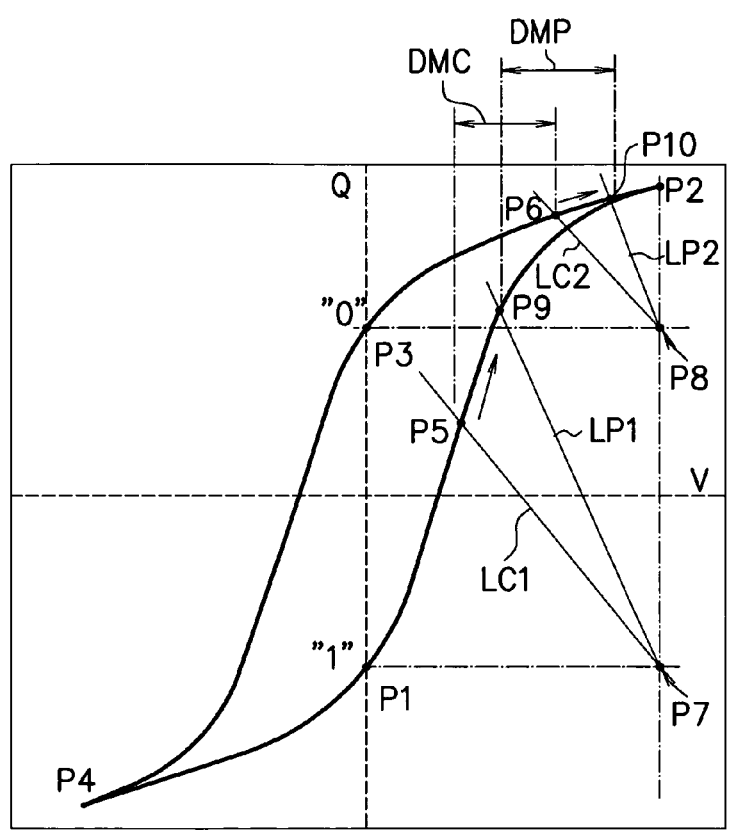
FIG. 6 is a view showing a change of a polarization charge amount of the ferroelectric capacitor in the data read operation on the ferroelectric memory according to the first embodiment.

FIG. 6 is a view showing a change of polarization charge amounts of the ferroelectric capacitors C1, C2 in the data read operation on the ferroelectric memory according to the first embodiment shown in the above-described FIG. 3. In FIG. 6, the horizontal axis represents a voltage applied to the ferroelectric capacitor, and the vertical axis represents the polarization charge amount.

Incidentally, in FIG. 6, the change of the polarization charge amount of the ferroelectric capacitor in the data read operation on the conventional ferroelectric memory is also shown with the same numerals and symbols used in FIG. 1 and FIG. 2, for comparison purposes.

In the data read operation, when the electric potential of the word line WL1 is turned to "H", and the electric potential of the plate line PL1 is turned to "H" (+VDD), the potential differences between the electric potential of the plate line PL1 and the electric potentials of the bit lines BL, /BL are respectively applied to the ferroelectric capacitors C1, C2. Herewith, the respective data points shift toward the direction in which the applied voltage value is increasing on a hysteresis curve as shown by arrows in FIG. 6, and the electric charges are supplied from the ferroelectric capacitors C1, C2 in accordance with the applied voltages.

Here, in the ferroelectric memory according to the first embodiment, the electric charges of the bit lines BL, /BL are extracted via the resistors R1, R2 connected relative to the ground, and thereby, the capacities of the bit lines BL, /BL are increased artificially. Absolute values of inclination of lines LP1, LP2 of which load capacitances are the artificial capacity of the bit line BL become larger than those of the lines LC1, LC2, respectively. Herewith, an operating point P9 when the "1" data is read, being an intersection point of the line LP1 (a reference point thereof is a point P7) with the hysteresis curve, and an operating point P10 when the "0" data is read, being an intersection point of the line LP2 (a reference point thereof is a point P8) with the hysteresis curve change to the side in which the applied voltages are increasing compared to the conventional operating points P5, P6.

That is to say, a more electric charge can be drawn from the ferroelectric capacitor C1 storing the "1" data. On the other hand, as shown in FIG. 6, the ferroelectric capacitor C2 storing the "0" data is already applied a sufficient voltage, and the electric charge amount which can further be drawn from the ferroelectric capacitor C2 by extracting the electric charge from the bit line /BL is smaller compared to that of the ferroelectric capacitor C1. However, the electric potential change of the bit lines BL, /BL according to the changes shown by the operating points P9, P10 have trends that the electric potential of the bit line BL corresponding to the "1" data increases, and the electric potential of the bit line /BL corresponding to the "0" data decreases as shown in FIG. 5B, and therefore, a data margin DMP between the "1" data and the "0" data becomes larger compared to the conventional data margin DMC.

Figure 7:
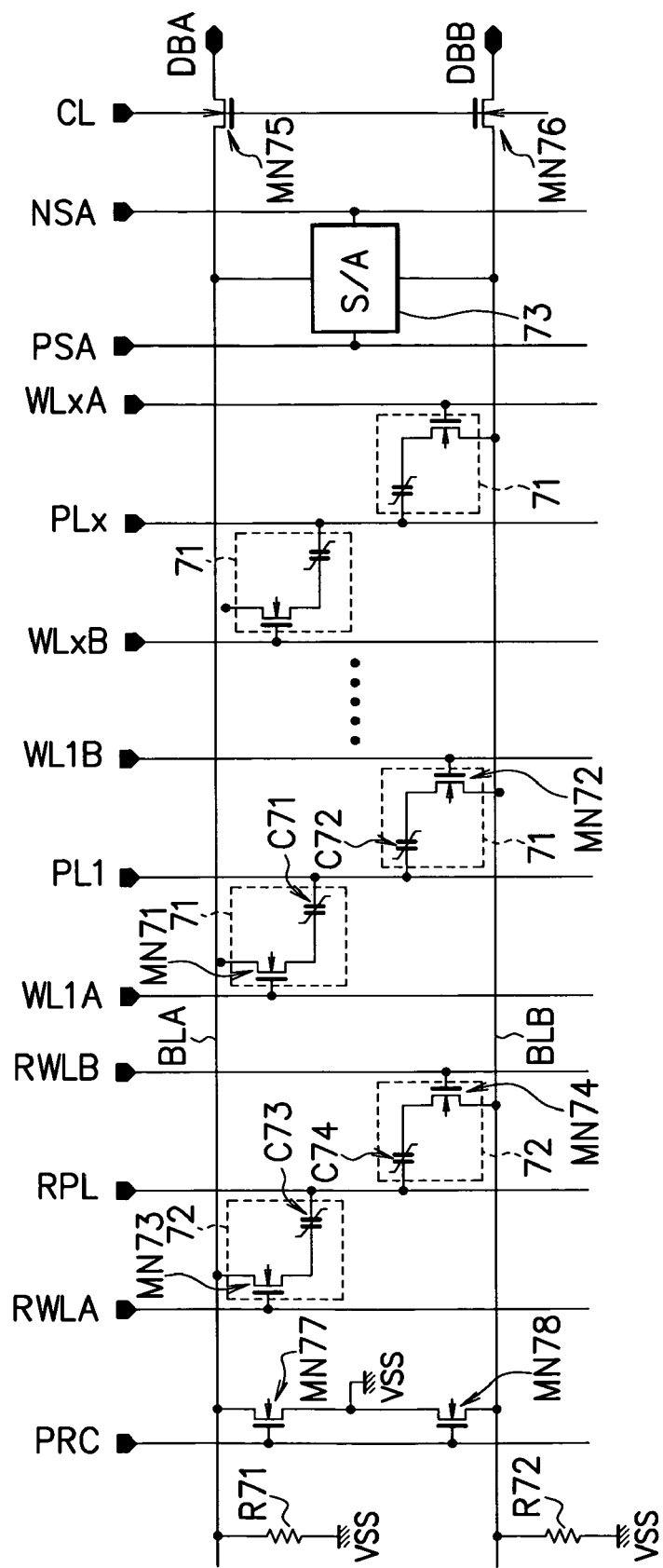
FIG. 7 is a circuit diagram showing another example of the column portion of the ferroelectric memory according to the first embodiment.

Incidentally, in the above description, the ferroelectric memory having the column portion 13 constituted by the two transistors/two capacitors (2T/2C) type memory cell is explained as an example, but the present invention is applicable to a ferroelectric memory having a column portion constituted by a one transistor/one capacitor (1T/1C) type memory cell as shown in FIG. 7. In the 1T/1C type memory cell, one memory cell is constituted by one transistor and one ferroelectric capacitor.

FIG. 7 is a circuit diagram showing another example of the column portion 13 of the ferroelectric-memory according to the first embodiment.

In FIG. 7, BLA, BLB are a first and a second bit lines, WLjA, WLjB are a first and a second word lines, PLj is a plate line (j is a subscript, and an arbitrary natural number of j=1 to x), RWLA, RWLB are a first and a second reference word lines, RPL is a reference plate line, and DBA, DBB are a first and a second data signal lines. PRC, CL, PSA, NSA correspond to the precharge signal line, the column signal line, the control signal line shown in the above-described FIG. 2.

The column portion 13 shown in FIG. 7 has a plurality of memory cells 71, 71', reference cells 72, 72' to output a reference electric potential, and a sense amplifier 73 to amplify a potential difference between the bit lines BLA, BLB. The memory cell 71 (71') is connected to the bit line BLA (BLB), the word line WLjA (WLjB), and the plate line PLj, and the reference cell 72 (72') is connected to the bit line BLA (BLB), the reference word line RWLA (RWLB), and the reference plate line RPL.

Configurations of the memory cells 71, 71' are described. Hereinafter, the configuration is described with reference to the memory cell 71 connected to the first word line WL1A, the plate line PL1, and the memory cell 71' connected to the second word line WL1B, the plate line PL1, but the configurations of the other memory cells 71, 71' are respectively the same.

The memory cell 71 is constituted by an N-channel MOS transistor MN71 as a cell transfer, and a ferroelectric capacitor C71. A source of the transistor MN71 is connected to the first bit line BLA, a gate thereof is connected to the first word line WL1A. One electrode of the ferroelectric capacitor C71 is connected to a drain of the transistor MN71, and the other electrode is connected to the plate line PL1. The memory cell 71' is constituted by an N-channel MOS transistor MN72 and a ferroelectric capacitor C72, and it is the same as the memory cell 71 except for the point that it is connected to the second bit line BLB and to the second word line WL1B.

Next, configurations of the reference cells 72, 72' are described.

The reference cells 72, 72' are respectively constituted by one of N-channel MOS transistors MN73, MN74, and one of ferroelectric capacitors C73, C74. A source of the transistor MN73 is connected to the first bit line BLA, and a gate thereof is connected to the first reference word line RWLA. One electrode of the ferroelectric capacitor C73 is connected to a drain of the transistor MN73, and the other electrode is connected to the reference plate line RPL. The reference cell 72' is the same as the reference cell 72 except for the point that it is connected to the second bit line BLB and to the second reference word line RWLB.

N-channel MOS transistors MN75, MN76, MN77, MN78, and resistors R71, R72 are respectively corresponding to the transistors MN3, MN4, MN5, MN6, and the resistors R1, R2 shown in FIG. 2, and therefore, the explanation is not given.

Figure 8:
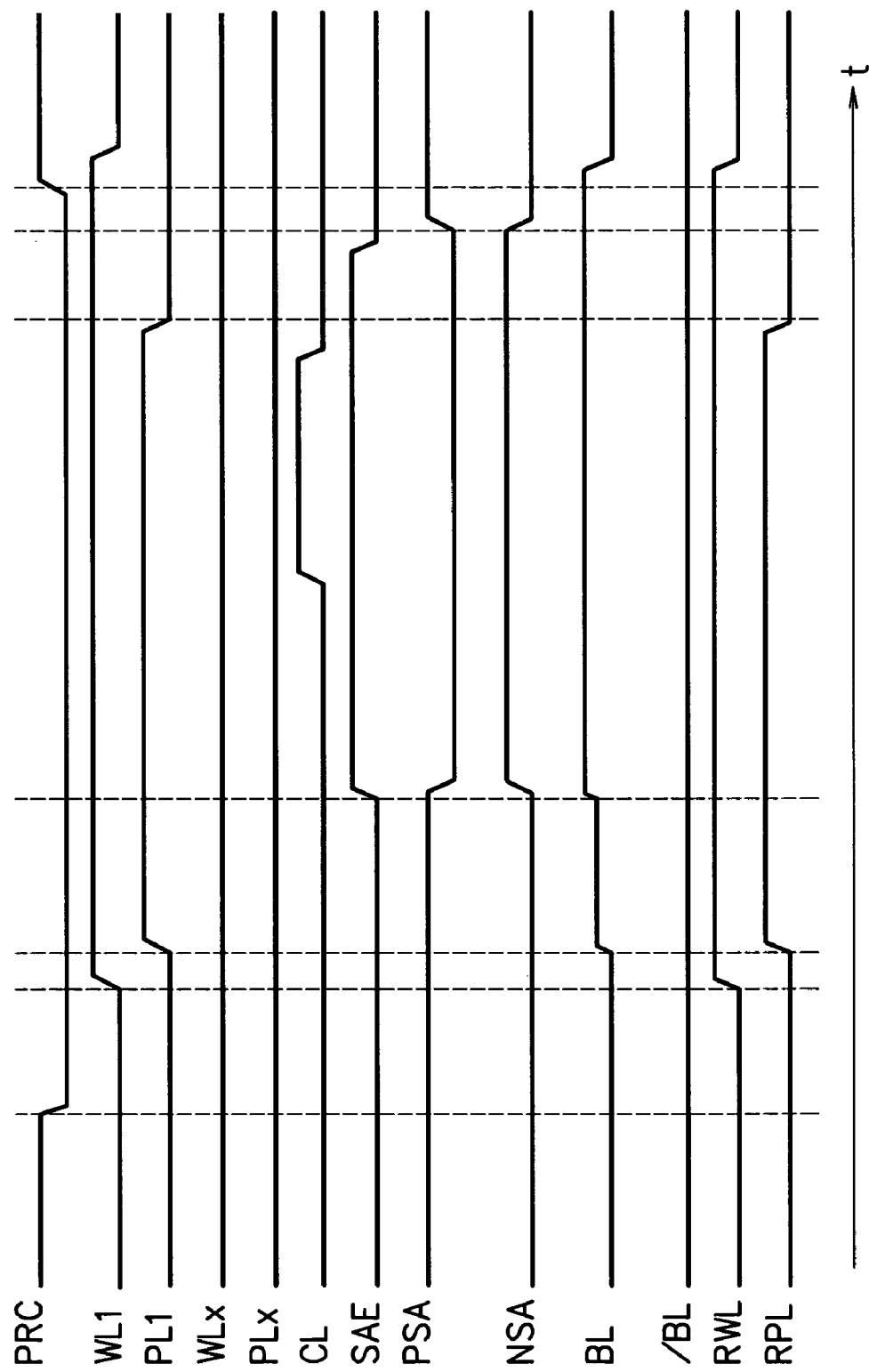
FIG. 8 is a timing chart showing the data read operation on the ferroelectric memory shown in FIG. 7.

FIG. 8 is a timing chart showing a data read operation on the ferroelectric memory shown in FIG. 7. The operation and a principle of the data read operation on the ferroelectric memory constituted by the 1T/1C type memory cell shown in FIG. 7 are the same as the data read operation on the ferroelectric memory constituted by the 2T/2C type memory cell shown in the above-stated FIG. 4, except for different points described below (the word line (reference word line) and the plate line (reference plate line) driving controlled during the read operation)).

The different points between the data read operation on the ferroelectric memory constituted by the 2T/2C type memory cell and the data read operation on the ferroelectric memory constituted by the 1T/1C type memory cell are described. In the data read operation on the ferroelectric memory constituted by the 2T/2C type memory cell shown in the above-described FIG. 4, a set of the word line WLj and the plate line PLj is driving controlled. On the contrary, in the data read operation on the ferroelectric memory constituted by the 1T/1C type memory cell shown in FIG. 7, a set of the word lines WLjA, WLjB and the plate line PLj, the reference word lines RWLA, RWLB and the reference plate line RPL are driving controlled. Concretely, when a set of the word line WLjA and the plate line PLj is driving controlled, the reference word line RWLB and the reference plate line RPL are driving controlled, and when a set of the word line WLjB and the plate line PLj is driving controlled, the reference word line RWLA and the reference plate line RPL are driving controlled.

As stated above in detail, according to the first embodiment, in the ferroelectric memory, the clamp circuits constituted by the resistors R1, R2 of which one ends are connected relative to the reference potentials VSS are connected to the bit lines BLi, /BLi (BLA, BLB), and thereby, in the data read operation, a part of the electric charges supplied from the ferroelectric capacitors C1, C2 to the bit lines BLi, /BLi (BLA, BLB) flows into the nodes being supplied with the reference potential, via the resistors R1, R2. Herewith, the capacities of the bit lines are increased artificially, and it is possible to draw the electric charges from the ferroelectric capacitors C1, C2 efficiently to generate the electric potentials of the bit lines. Therefore, the electric potential of the bit line corresponding to the "1" data becomes high, and the electric potential of the bit line corresponding to the "0" data becomes low, compared to the conventional means, and therefore, a large potential difference between the bit lines can be obtained. Consequently, the data margin becomes large compared to the conventional means, and it is possible to suppress the occurrence of the error sensing of data, and so on, and to make the operating life of the device longer.

Besides, according to the first embodiment, during the data read operation, an influence becomes smaller, which is given to the electric potentials appeared on the bit lines BLi, /BLi (BLA, BLB) by a ratio between the capacity of the bit line and the capacity of the ferroelectric capacitor. Therefore, the number of memory cells and the number of the word lines connected to one bit line can be arbitrary selected, and therefore, the flexibility of the block configuration (memory cell configuration, and so on) in the ferroelectric memory becomes high.

Further, the bit line corresponding to the "0" data is constantly discharged to the reference potential VSS side by the clamp circuit, and therefore, it is possible to suppress an instability of a circuit operation caused by an influence of a power supply line of the sense amplifier 22 by the convergence of the electric charge to the reference potential VSS side occurs during a sensing operation of the sense amplifier 22.

Second Embodiment

Next, a second embodiment is described.

In the ferroelectric memory according to the above-described first embodiment, between the bit lines BLi, /BLi (BLA, BLB) and the reference potentials VSS are steadily in continuity states via the clamp circuits, and it is constituted so as to approximate the electric potentials of the bit lines BLi, /BLi (BLA, BLB) to the reference potentials VSS constantly. Consequently, for example, even when the sense amplifier is active in the data read operation and during the data write operation, and so on, the electric potentials of the bit lines BLi, /BLi (BLA, BLB) are different from the reference potential VSS, and therefore, a current flows via the clamp circuits, and an electric power is overconsumed.

In consideration of the above, a ferroelectric memory applying a semiconductor memory device according to the second embodiment of the present invention described below, an operation of a clamp circuit in accordance with an operation state in the ferroelectric memory is controlled to prevent an unnecessary current from being supplied, and to suppress an increase of an electric power consumption.

An entire configuration of the ferroelectric memory applying the semiconductor memory device according to the second embodiment of the present invention is the same as the ferroelectric memory according to the first embodiment shown in the above-described FIG. 1, and therefore, the explanation thereof is not given.

Figure 9:
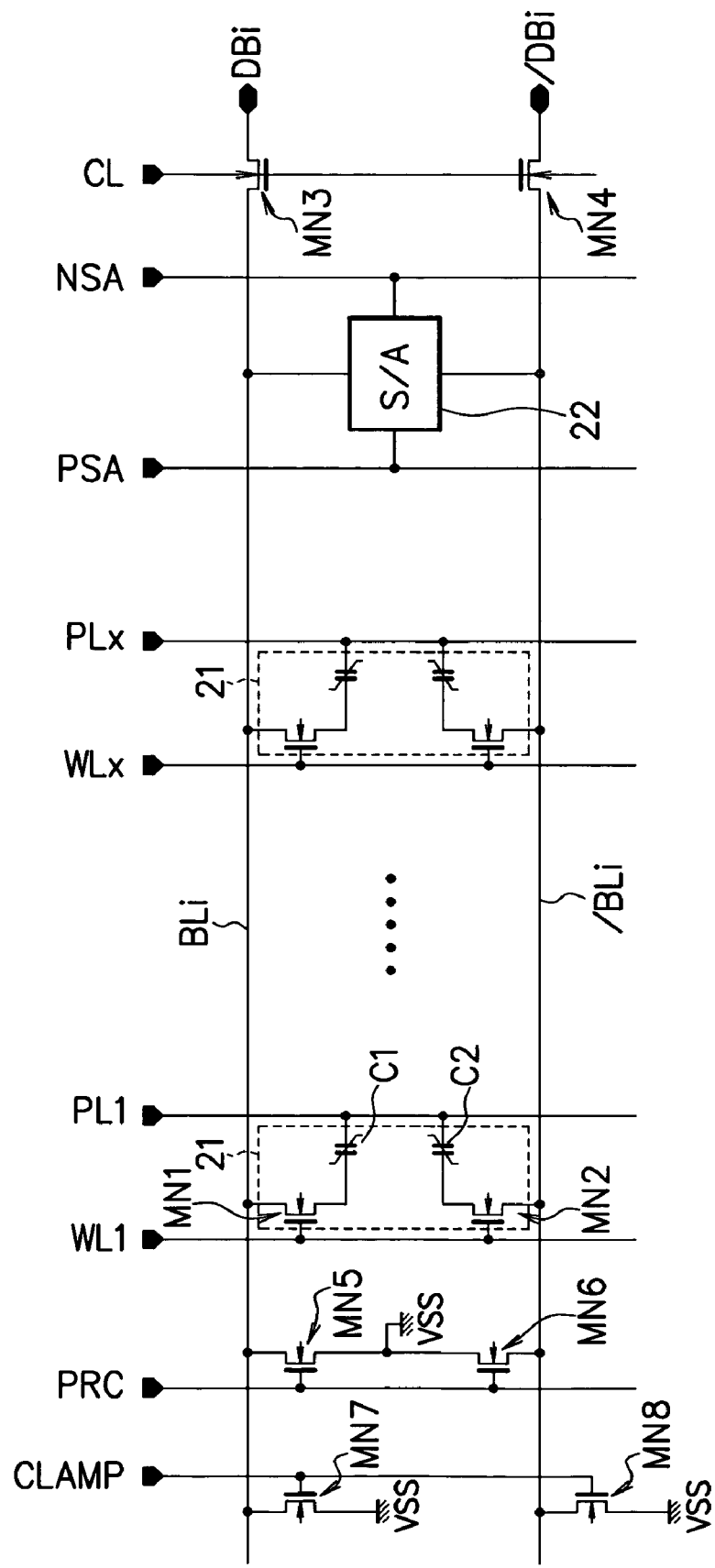
FIG. 9 is a circuit diagram showing an example of a column portion of a ferroelectric memory according to a second embodiment of the present invention.

FIG. 9 is a circuit diagram showing an example of a column portion 13' of the ferroelectric memory according to the second embodiment. Incidentally, in this FIG. 9, the same reference numerals and symbols are used to designate circuit components, and so on, having the same function as the circuit components, and so on, in FIG. 2, and the overlapped description thereof will not be given.

In FIG. 9, MN7, MN8 are N-channel MOS transistors, and drains of the transistors MN7, MN8 are respectively connected to bit lines BLi, /BLi. Besides, sources of the transistors MN7, MN8 are connected relative to reference potentials VSS (for example, ground (GND)), and gates thereof are connected to a clamp control signal line CLAMP.

Further, the transistors MN7, MN8 have different configurations from the other transistors MN1 to MN6, and so on, and have ON resistors corresponding to the resistance values of the resistors R1, R2 shown in the above-described FIG. 2, by making, for example, a channel length (gate length) larger or making a channel width (gate width)

smaller. Namely, the transistors MN7, MN8 constitute clamp circuits having a switching function which enables an ON/OFF controlling.

Figure 10:
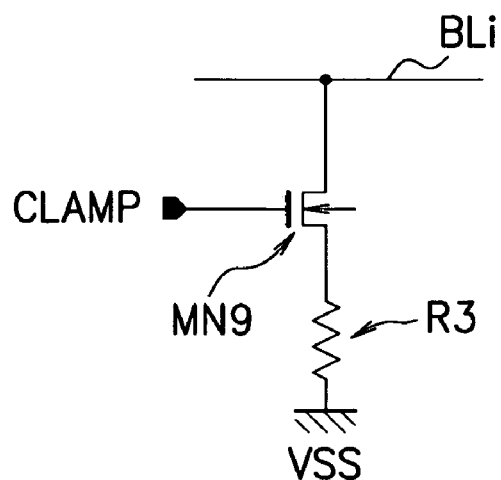
FIG. 10 is a circuit diagram showing another example of a clamp circuit according to the second embodiment.

Incidentally, in the above-described FIG. 9, the respective transistors MN7, MN8 are constituting the clamp circuits having switching functions, but for example, as shown in FIG. 10, it is also acceptable to constitute a clamp circuit having a switching function with a combination of an N-channel MOS transistor MN9 as a switching circuit and a resistor R3 as a clamp circuit.

A drain of the transistor MN9 is connected to the bit line BLi (/BLi), a gate thereof is connected to the clamp control signal line CLAMP. The resistor R3 is corresponding to the resistor R1 (R2) shown in FIG. 2, and one end thereof is connected to a source of the transistor MN9, and the other end is connected to the reference potential VSS. When it is configured as shown in the above-described FIG. 10, a transistor which has the same structure as, for example, the other transistors MN1 to MN6 can be used as the transistor MN9.

Next, a control of the clamp circuits having the switching function shown in FIG. 9 and FIG. 10, and an operation of the ferroelectric memory according to the second embodiment are described. Incidentally, in the following description, the case when the operation of the clamp circuit is stopped when a sense amplifier is active, the case when the operation of the clamp circuit is stopped during a data write operation, and the case when the operation of the clamp circuit is stopped at both time when the the sense amplifier is active, and during the data write operation, are explained. Besides, the operation is described with reference to FIG. 9, for explanatory convenience.

Figure 11:
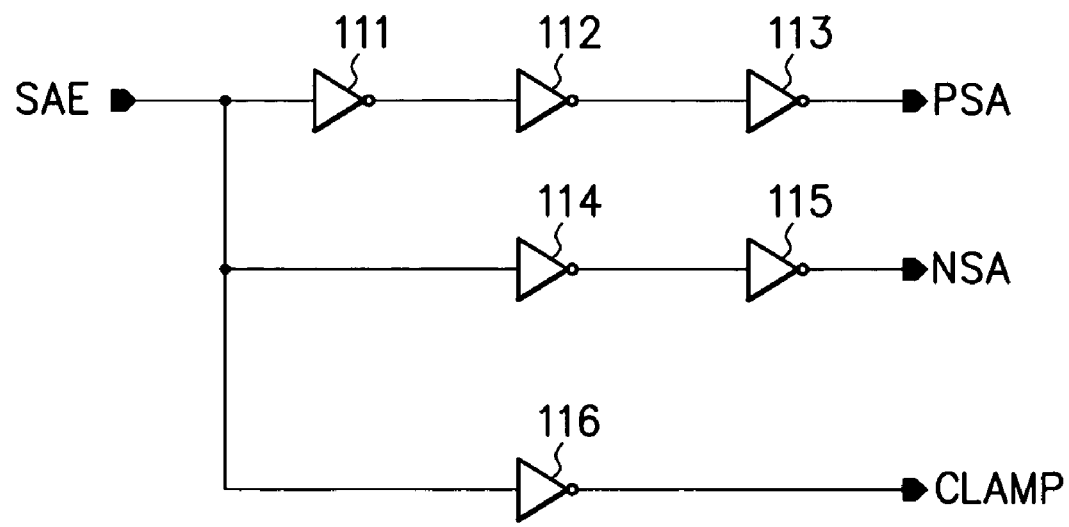
FIG. 11 is a circuit diagram showing an example of a clamp control signal generation circuit.

-The Case when the Operation of the Clamp Circuit is Stopped when the Sense Amplifier is Active- FIG. 11 is a circuit diagram showing an example of a clamp control signal generation circuit to stop the operation of the clamp circuit when the sense amplifier is active.

In FIG. 11, 111 to 116 are inverters which invert and output inputted signals. The inverters 111, 112, 113 are connected in cascade, a sense amplifier signal SAE is inputted to the inverter 111, and an operation result is outputted from the inverter 113 as a control signal PSA. Similarly, the inverters 114, 115 are connected in cascade, the sense amplifier signal SAE is inputted to the inverter 114, and the operation result is outputted from the inverter 115 as a control signal NSA. The inverter 116 is inputted the sense amplifier signal SAE, and outputs the operation result as a clamp control signal CLAMP.

That is to say, the clamp control signal generation circuit shown in FIG. 11 outputs the control signal PSA and the clamp control signal CLAMP which are in same phases with the sense amplifier signal SAE, and outputs the control signal NSA which is in a reverse phase with the sense amplifier signal SAE.

Figure 12:
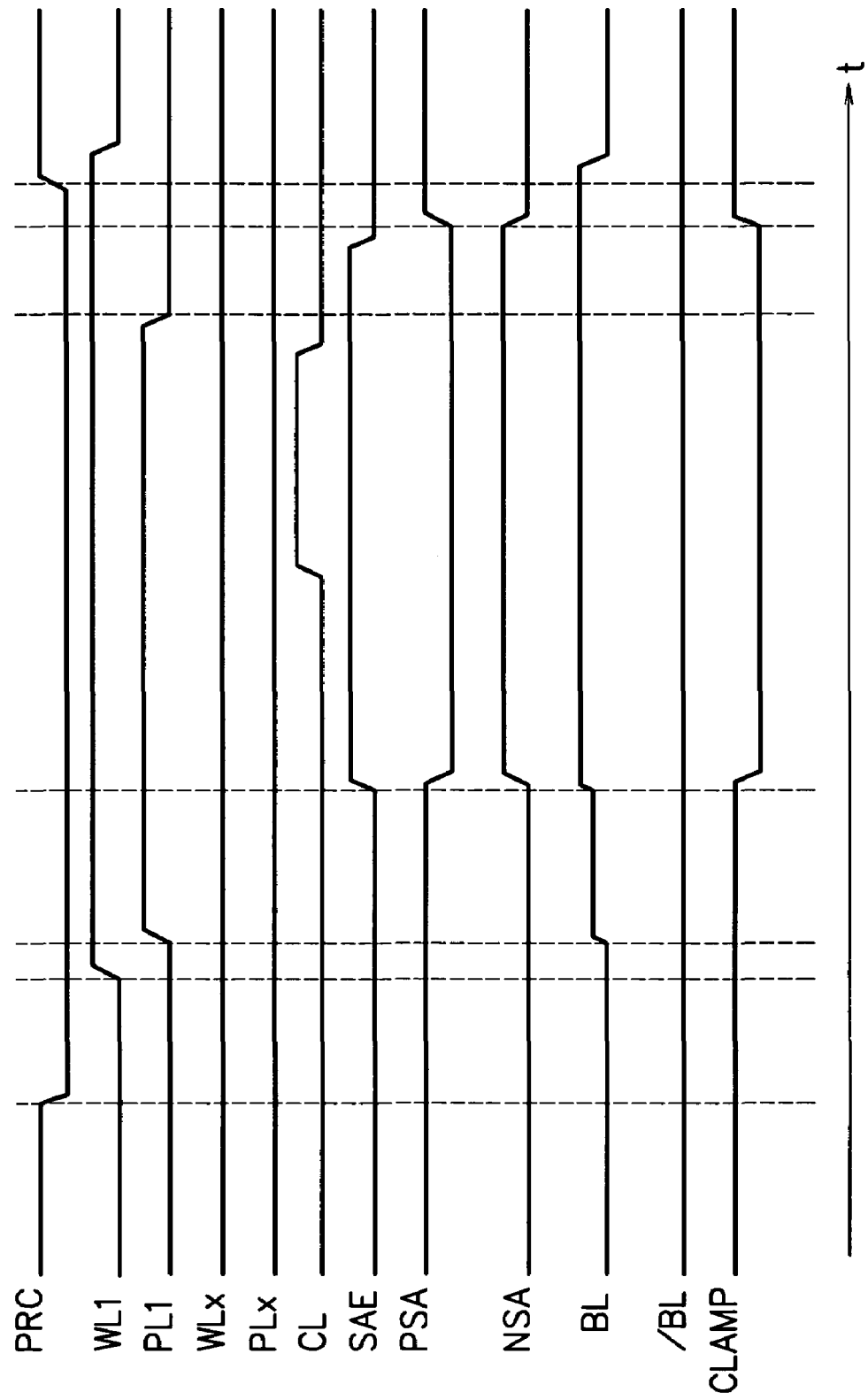
FIG. 12 is a timing chart showing a data read operation on the ferroelectric memory including the clamp control signal generation circuit shown in FIG. 11.

FIG. 12 is a timing chart showing a data read operation on the ferroelectric memory including the clamp control signal generation curcuit shown in FIG. 11, and it is the same as the data read operation on the ferroelectric memory according to the first embodiment shown in the above-described FIG. 3, except for a control of the clamp circuit (the electric potential of the clamp control signal line CLAMP: clamp control signal).

As shown in FIG. 12, in the data read operation, after the read operation is started, the electric potential of the clamp control signal line CLAMP is "H" until the sense amplifier signal SAE is activated to "H" and the sense amplifier 22 is activated. Therefore, the transistors MN7, MN8 held by the clamp circuits are respectively in ON states, and the clamp circuits operate so as to approximate the electric potentials of the bit lines BL, /BL to the reference potentials VSS.

Subsequently, when the sense amplifier signal SAE is activated to "H", the electric potential of the clamp control signal line CLAMP changes to "L". The electric potential of the clamp control signal line CLAMP turns to "L", and thereby, the transistors MN7, MN8 become to OFF states to cut off current paths between the bit lines BL, /BL and the reference potentials VSS via the clamp circuits (stop of the operation of the clamp circuit).

Herewith, when the sense amplifier 22 is active, it is possible to prevent an unnecessary current from being supplied via the clamp circuits, and the current from passing through (leak of electric charge) from a P-channel MOS transistor in the sense amplifier 22 to the reference potentials VSS. Further, it becomes possible to make the electric potentials of the bit lines BL, /BL to reach the voltage VDD, and therefore, a sufficient voltage can be applied to the ferroelectric capacitor.

-The Case when the Operation of the Clamp Circuit is Stopped During a Data Write Operation- FIG. 13 is a circuit diagram showing an example of the clamp control signal generation circuit to stop the operation of the clamp circuit during the data write operation (when a not-shown write amplifier is active).

In FIG. 13, 131, 132 are inverters. The inverters 131, 132 are connected in cascade, a write enable signal WE is inputted to the inverter 131, and the operation result is outputted from the inverter 132 as the clamp control signal CLAMP. Namely, the clamp control signal generation circuit shown in FIG. 13 outputs the clamp control signal CLAMP which is in the same phase with the write enable signal WE.

Figure 14:
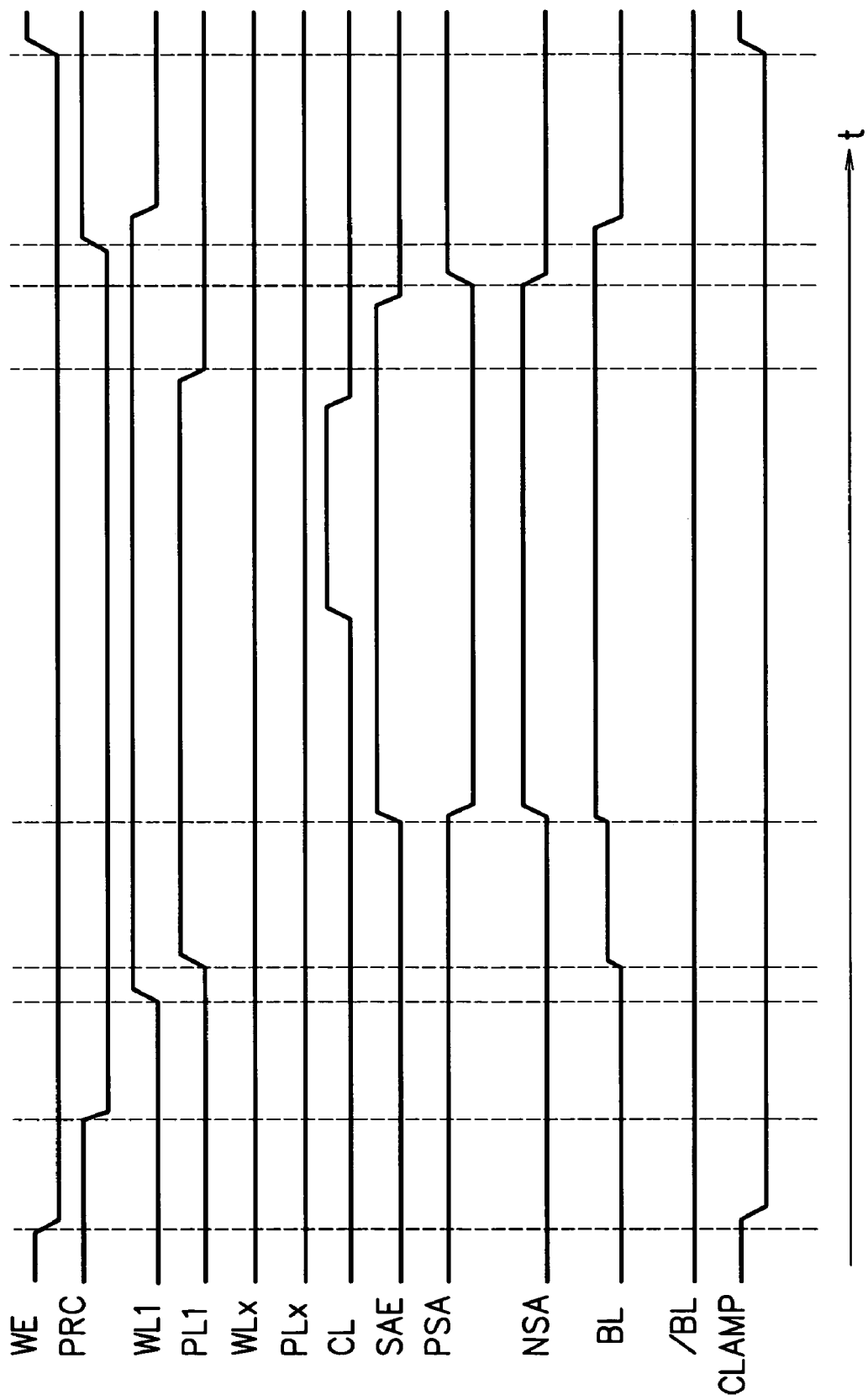
FIG. 14 is a timing chart showing a data read operation on the ferroelectric memory including the clamp control signal generation circuit shown in FIG. 13.

FIG. 14 is a timing chart showing the data write operation on the ferroelectric memory including the clamp control signal generation circuit shown in FIG. 13.

In accordance with the activation of a not-shown chip select signal by a data write request from external, the write enable signal WE is activated to "L". Herewith, the electric potential of the clamp control signal line CLAMP changes from "H" to "L", the transistors MN7, MN8 become to the OFF states, and the current paths between the bit lines BL, /BL and the reference potentials VSS via the clamp circuits are cut off (stop of operation of the clamp circuit).

Subsequently, the electric potential of the precharge signal line PRC is inactivated to "L", and the data write is executed. Incidentally, the data write operation is the same as that of the conventional ferroelectric memory as shown in FIG. 14, and therefore, the description is not given.

Subsequently, the writing of the data is finished, the write enable signal WE is inactivated from "L" to "H", and then, the electric potential of the clamp control signal line CLAMP changes from "L" to "H". Herewith, the transistors MN7, MN8 become to the ON states, and between the bit lines BL, /BL and the reference potentials VSS becomes to a continuity state via the clamp circuits.

As stated above, during the data write operation, it is possible to prevent the unnecessary current from being supplied via the clamp circuits, and the current from passing through (leak of electric charge) from the P-channel MOS transistor held by the not-shown write amplifier to the reference potential VSS.

Figure 15A:
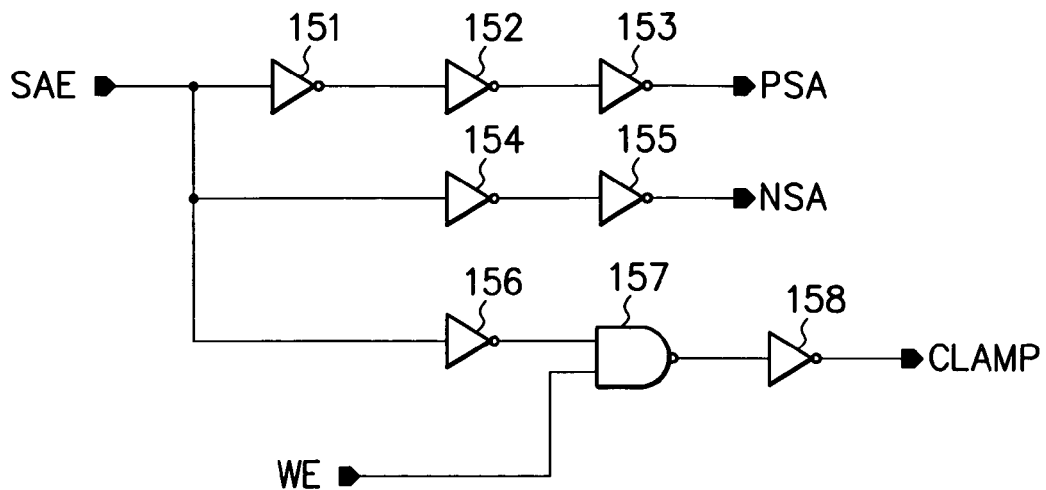
FIG. 15A is a circuit diagram showing the other example of the clamp control signal generation circuit.

-The Case when the Operation of the Clamp Circuit is Stopped when the Sense Amplifier is Active and During the Data Write Operation- FIG. 15A is a circuit diagram showing an example of the clamp control signal generation circuit to stop the operation of the clamp circuit when the sense amplifier is active and during the data write operation.

In FIG. 15A, 151 to 156, and 158 are inverters, and 157 is a Negative-AND operation (NAND) circuit. As it is the same as the clamp control signal generation circuit shown in FIG. 11, the inverters 151, 152, 153 are connected in cascade, and output a signal in a reverse phase with the inputted sense amplifier signal SAE, as a control signal PSA. Besides, the inverters 154, 155 are connected in cascade, and output a signal in a same phase with the inputted sense amplifier signal SAE, as a control signal NSA.

To one of the input of the NAND circuit 157, the output of the inverter 156 is inputted, to which the sense amplifier signal SAE is inputted, and to the other input, the write enable signal WE is inputted. Further, the output of the NAND circuit 157 which is an operation result of the NAND circuit 157, is inputted to the inverter 158, and the operation result is outputted from the inverter 158 as a clamp control signal CLAMP.

Figure 15B:
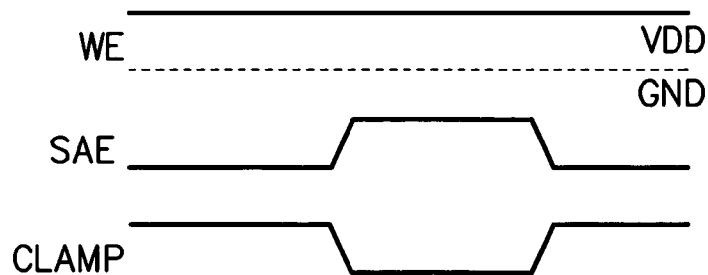
FIG. 15B and FIG. 15C are views showing clamp signals generated by the clamp control signal generation circuit shown in FIG. 15A.

Consequently, as shown in FIG. 15B, when the sense amplifier is active (when the sense amplifier signal SAE is "H"), the output of the inverter 156 changes to "L", and thereby, the output of the NAND circuit 157 changes to "H". Herewith, the clamp control signal CLAMP outputted from the inverter 158 changes to "L".

Figure 15C:
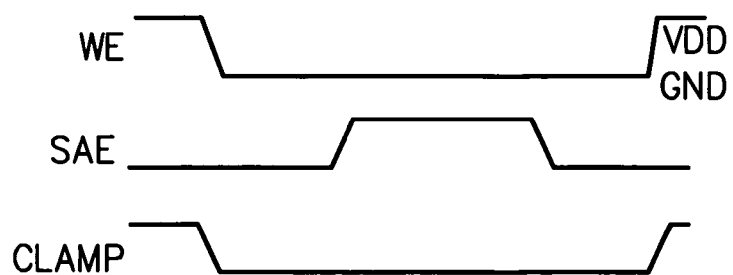

Besides, as shown in FIG. 15C, during the data write operation (when the write enable signal WE is "L"), one of the input of the NAND circuit 157 is "L", and therefore, the output changes to "H", and the clamp control signal CLAMP outputted from the inverter 158 changes to "L".

Herewith, when the sense amplifier 22 is active, and during the data write operation, it is possible to prevent the unnecessary current from being supplied via the clamp circuits. Consequently, it is possible to prevent the current from passing through from the P-channel MOS transistor in the sense amplifier 22 to the reference potential VSS, and the current from passing through from the P-channel MOS transistor held by the not-shown write amplifier to the reference potential VSS when the sense amplifier 22 is active.

Incidentally, as for the above-described second embodiment, the ferroelectric memory having the column portion constituted by the 2T/2C type memory cell is described as an example, but it is also applicable to the ferroelectric memory having the column portion constituted by the 1T/1C type memory cell as same as the above-described first embodiment.

Besides, the configurations of the clamp control signal generation circuits shown in the above-described FIG. 11, FIG. 13, and FIG. 15A are examples, and it is acceptable if a similar clamp control signal can be generated, and it can be constituted by using a different logic circuit.

As described above, according to the second embodiment, in addition to the effect obtained by the above-described first embodiment, the operation of the clamp circuit is controlled, for example, when the sense amplifier is active in the data read operation and during the data write operation, and so on, the operation of the clamp circuit is stopped, the current paths between the bit lines BLi, /BLi and the reference potentials VSS are cut off, and thereby, it becomes possible to prevent the unnecessary current from flowing via the clamp circuit, and to suppress the increase of the electric power consumption. Further, by stopping the operation of the clamp circuit, it becomes possible to suppress the generation of a noise, and so on, and to improve a reliability.

Third Embodiment

Next, a third embodiment is described.

In the ferroelectric memories according to the above-described first and second embodiments, the clamp circuit for approximating the electric potential of the bit line to the reference potential VSS, is constituted by using one resistor, or one transistor. However, there is a case when a characteristic dispersion occurs depending on a disposed position caused by a process dispersion, and so on, in the resistor or the transistor constituting the clamp circuit. Consequently, a ferroelectric memory applying a semiconductor memory device according to the third embodiment is to reduce an influence caused by the characteristic dispersion by constituting the clamp circuits according to the above-stated first and second embodiments with a plurality of elements.

An entire constitution of the ferroelectric memory applying the semiconductor memory device according to the third embodiment of the present invention is the same as the ferroelectric memory according to the first embodiment shown in the above-described FIG. 1, and therefore, the explanation is not given.

Figure 16:
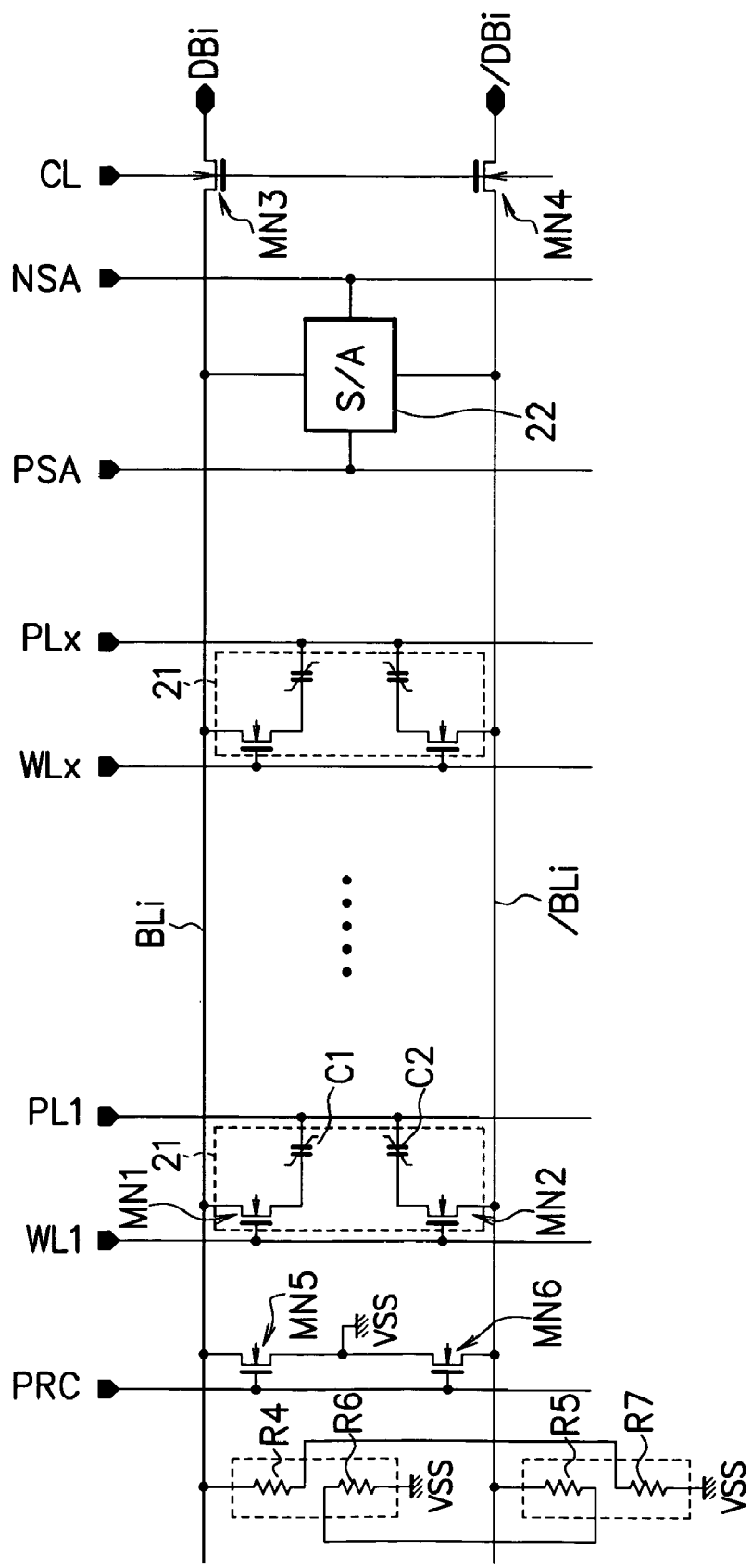
FIG. 16 is a circuit diagram showing an example of a column portion of a ferroelectric memory according to a third embodiment of the present invention.
Figure 17:
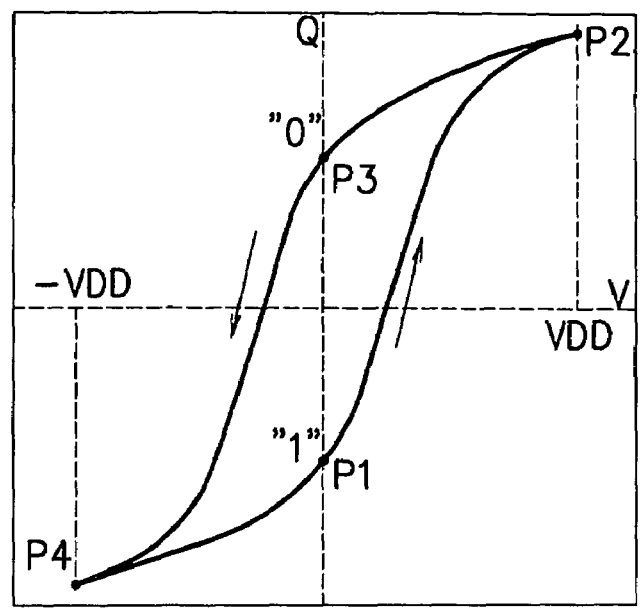
FIG. 17 is a view showing a hysteresis characteristic of a ferroelectric capacitor.
Figure 18:
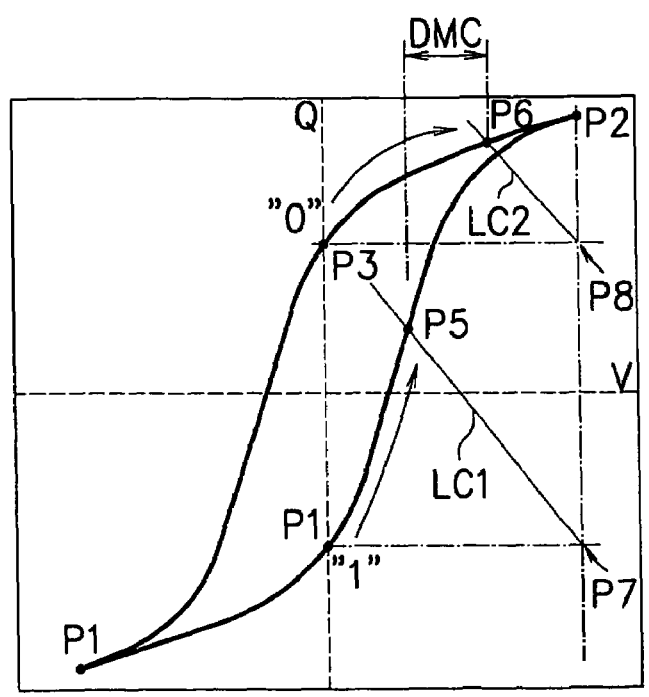
FIG. 18 is a view showing a change of a polarization charge amount of a ferroelectric capacitor in a data read operation in the conventional ferroelectric memory.

FIG. 16 is a circuit diagram showing an example of a column portion of the ferroelectric memory according to the third embodiment. Incidentally, in FIG. 16, the same reference numerals and symbols are used to designate circuit components, and so on, having the same function as the circuit components, and so on, shown in FIG. 2, and the overlapped description thereof will not be given.

In FIG. 16, R4, R5, R6, R7 are resistors, the resistor R6 is disposed in a vicinity position (for example, adjacent position) of the resistor R4, and the resistor R7 is disposed in the vicinity position (for example, adjacent position) of the resistor R5. One end of the resistor R4 is connected to the bit line BLi, and the other end is connected to one end of the resister R7. Similarly, one end of the resistor R5 is connected to the bit line /BLi, and the other end is connected to one end of the resistor R6. Besides, the other ends of the resistors R6, R7 are connected relative to the reference potentials VSS. Here, a resistance value of the resistor R4 and the resistor R6, and the resistance value of the resistor R5 and the resistor R7 correspond to the resistance values of the resistors R1, R2 shown in FIG. 2.

Incidentally, in the above-stated explanation, a case when resistors are used as clamp elements is shown as an example, but the case when transistors are used as the clamp elements is the same. Further, in the above-stated explanation, the case when two clamp elements are used is described, but the number of the clamp elements is arbitrary. Besides, it is similarly applicable to a ferroelectric memory having a column portion constituted not only by the 2T/2C type memory cell but also by a 1T/1C type memory cell.

As described above, according to the third embodiment, a plurality of clamp elements are disposed in the vicinity position, and the plurality of clamp elements are connected to intersect as shown in FIG. 16. Herewith, in addition to the effect obtained by the above-stated first embodiment, even when the characteristic dispersion of the clamp elements depending on the position occurs, it is possible to average the characteristics of the clamp elements to reduce the influence of the characteristic dispersion. Further, it is possible to approximately equalize the resistance values between the bit lines BLi, /BLi and the reference potentials VSS via the clamp circuits, independent of the bit lines BLi, /BLi.

Incidentally, in the above-stated first and second embodiments, the clamp circuit is constituted by the resistor, the transistor, or the resistor and the transistor, but a constant current source can also be used as the clamp circuit, in which it is possible to draw the same amount of electric charges from two bit lines of the column portion, respectively, and thereby, the same effect as the above-described first and second embodiments can be obtained. Besides, in the above-stated first to third embodiments, N-channel MOS transistors are used as every transistor, but the present invention is not limited to those.

Incidentally, the above-described embodiments are to be considered in all respects as illustrative and no restrictive. Namely, the present invention may be embodied in other specific forms without departing from the spirit or essential characteristics thereof.

INDUSTRIAL APPLICABILITY

As described above, according to the present invention, in a semiconductor memory device including memory cells respective having a ferroelectric capacitor, and are provided at intersection portions of sets of a plurality of word lines and adjacent plate lines, with bit lines, clamp circuits are respectively connected between the bit lines and nodes being supplied with reference potentials. Herewith, the electric charges supplied from the ferroelectric capacitors to the bit lines are extracted by the clamp circuits, and thereby, capacities of the bit lines are increased artificially, and an effective supply of the electric charges from the ferroelectric capacitors to the bit lines becomes possible. Consequently, in a data read operation, a large potential difference between the bit lines can be obtained, and thereby, a data margin becomes larger in comparison with the conventional means, and it becomes possible to suppress the occurrence of an error sensing of data, and so on, and makes an operating life of a device longer.

What is claimed is:

1. A semiconductor memory device, comprising:
    a plurality of word lines;
    a plurality of plate lines respectively provided adjacent to said word lines;
    a plurality of bit lines provided in an orthogonal direction relative to said word lines and said plate lines;
    a plurality of memory cells provided at intersection portions of sets of said word lines and said plate lines, with said bit lines, and respective having a ferroelectric capacitor; and
    a plurality of clamp circuits respectively connected between said bit lines and nodes being supplied with reference potentials, and
        wherein each clamp circuit is a transistor whose ON resistance is larger than that of a transistor constituting said memory cell, in which a drain is connected to one of said plurality of bit lines, a source is connected to the node being supplied with the reference potential, and a gate is connected to a control signal line.

2. The semiconductor memory device according to claim 1;
    wherein each memory cell has one transistor and one ferroelectric capacitor.

3. The semiconductor memory device according to claim 1;
    wherein each memory cell has two transistors and two ferroelectric capacitors, and is provided at an intersection portion of a set of one of said plurality of word lines and one of said plurality of plate lines, with a pair of said plurality of bit lines.

4. The semiconductor memory device according to claim 1;
    wherein each clamp circuit has a switching function controlling whether between said bit line and the node being supplied with the reference potential is electrically connected or not.

5. The semiconductor memory device according to claim 4;
    wherein each clamp circuit insulates between said bit line and the node being supplied with the reference potential when a sense amplifier amplifying a potential difference between said bit lines is active.

6. The semiconductor memory device according to claim 4;
    wherein each clamp circuit insulates between one of said plurality of bit lines and the node being supplied with the reference potential during a data write operation.

7. The semiconductor memory device according to claim 4;
    wherein each clamp circuit insulates between one of said plurality of bit lines and the node being supplied with the reference potential when the sense amplifier amplifying the potential difference between said bit lines is active and during the data write operation.

8. The semiconductor memory device according to claim 1;
    wherein the reference potential is a ground level.

9. The semiconductor memory device according to claim 1;
    wherein said clamp circuits respectively have a plurality of clamp elements, and the plurality of clamp elements are connected to intersect between the clamp circuits corresponding to a pair of bit lines.

10. The semiconductor memory device according to claim 1;
    wherein said clamp circuits respectively have two clamp elements, and a first clamp element of a first clamp circuit and a second clamp element of a second clamp circuit are connected, and a first clamp element of the second clamp circuit and a second clamp element of the first clamp circuit are connected in the first clamp circuit and the second clamp circuit respectively connected to a pair of bit lines.

11. The semiconductor memory device according to claim 1;
    wherein each clamp circuit is a constant current source circuit.

12. A semiconductor memory device comprising:
    a plurality of word lines;
    a plurality of plate lines respectively provided to adjacent to said word lines;
    a plurality of bit lines provided in an orthogonal direction relative to said word lines and said plate lines;
    a plurality of memory cells provided at intersection portions of sets of said word lines and said plate lines, with said bit lines, and respective having a ferroelectric capacitor; and
    a plurality of clamp circuits respectively connected between said bit lines and nodes being supplied with reference potentials
    wherein each clamp circuit has a switching function controlling whether between said bit line and the node being supplied with the reference potential is electrically connected or not, and wherein each clamp circuit has a transistor in which a drain is connected to one of said plurality of bit lines, and a gate is connected to the control signal line, and a resistor in which one end is connected to a source of the corresponding transistor and the other end is connected to the node being supplied with the reference potential.

* * * * *